US006641867B1

(12) United States Patent
Hsu et al.

(10) Patent No.: US 6,641,867 B1
(45) Date of Patent: *Nov. 4, 2003

(54) METHODS FOR CHEMICAL VAPOR DEPOSITION OF TUNGSTEN ON SILICON OR DIELECTRIC

(75) Inventors: Wei-Yung Hsu, Dallas, TX (US); Jiong-Ping Lu, Dallas, TX (US); August J. Fischer, Dallas, TX (US); Ming-Jang Hwang, Dallas, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 367 days.

(21) Appl. No.: 09/276,043

(22) Filed: Mar. 25, 1999

Related U.S. Application Data (60) Provisional application No. 60/080,076, filed on Mar. 31, 1998.

(51) Int. Cl.[7] .............................. B05D 5/12; B05D 1/36; C23C 16/00
(52) U.S. Cl. ............... 427/255.392; 427/99; 427/419.1; 427/419.7
(58) Field of Search .................... 427/99, 255.392, 427/253, 344, 419.1, 419.7; 438/648, 656, 675, 680, 685, 775

(56) References Cited

U.S. PATENT DOCUMENTS

| | | | | |
|---|---|---|---|---|
| 4,749,597 A | * | 6/1988 | Mendonca et al. | 427/253 |
| 4,847,111 A | * | 7/1989 | Chow et al. | 427/38 |
| 5,084,413 A | * | 1/1992 | Fujita et al. | 437/189 |
| 5,223,081 A | * | 6/1993 | Doan | 156/628 |
| 5,264,070 A | * | 11/1993 | Urquhart et al. | 156/603 |
| 5,556,506 A | * | 9/1996 | Contreras et al. | 156/625.1 |
| 5,643,632 A | * | 7/1997 | Lo | 427/250 |
| 5,670,388 A | * | 9/1997 | Machesney et al. | 437/21 |
| 5,719,410 A | * | 2/1998 | Suehiro et al. | 257/77 |
| 5,759,898 A | * | 6/1998 | Ek et al. | 438/291 |
| 5,882,961 A | * | 3/1999 | Klingbeil, Jr. et al. | 438/180 |

OTHER PUBLICATIONS

Hodson et al., "Plasma Enhanced Chemical Vapour Deposition of Tungsten on Silicon and Silicon Dioxide Substrates", Solid State Devices, pp. 327–330. 1988.*

Hodson, et al., *Plasma Enhanced Chemical Vapour Deposition of Tungsten On Silicon and Dioxide Substrates*, Solid State Devices, 1988, pp. 327–330.

(List continued on next page.)

*Primary Examiner*—Michael Barr
(74) *Attorney, Agent, or Firm*—Jacqueline J. Garner; Wade James Brady, III; Frederick J. Telecky, Jr.

(57) ABSTRACT

In situ nitridation of a thin layer of either silicon or tungsten provides an adhesive layer for bulk deposition of tungsten. Alternatively, a thin layer of silicon can be deposited directly on a dielectric, then reacted with WF6 to replace the silicon with tungsten, which provides a nucleation layer for bulk tungsten deposition.

1 Claim, 7 Drawing Sheets

(step 210)
Deposit Thin Layer of Tungsten.

(step 220)
Nitride Tungsten Layer.

(step 230)
Deposit Bulk Tungsten.

OTHER PUBLICATIONS

Weston, et al., *Process Integration of CVD W Via Plugs With a Fluorinated Polymide Interlevel Die;ectric*, Conference Proceedings ULSI–VII, 1992 Materials Research Society, pp. 479–484.

Chiu, et al. *Adhesion of Blanket Tungsten to Oxide*, 1987 Materials Research Society, pp. 177–186.

Oosterlaken, et al., *Deposition of Tungsten on Silicon Dioxide by GeH4 Reduction OB WF6*, Materials Research Society Symp. Proc. vol. 260, 1992, pp. 93–98.

Chang, et al., *Chemical Vapor Deposition Tungsten Via Plug Process Development With Polymide Interval Dielectric in a Multilevel Metal System*, Journal of Vaccum Science & Technology B, Second Series, vol. 10, No. 5, Sep./Oct. 1992, pp. 2277–2283.

Wong, et al., *Direct Tungsten on Silicon Dioxide Formed by RF Plasma–Enhanced Chemical Vapor Deposition*, IEEE, Nov. 1988, vol. 9, No. 11, pp. 582–584.

Woodruff, et al., *Adhesion of Non–Selective CVD Tungsten to Silicon Dioxide*, 1985 Materials Research Society Workshop, pp. 173–183.

* cited by examiner

N₂ or NH₃ plasma

METHODS FOR CHEMICAL VAPOR DEPOSITION OF TUNGSTEN ON SILICON OR DIELECTRIC

This application claims priority under 35 USC §119 (e)(1) of provisional application No. 60/080,076, filed Mar. 31, 1998.

BACKGROUND AND SUMMARY OF THE INVENTION

The present invention relates to integrated circuit structures and fabrication methods, and especially to the deposition of tungsten.

Background: CVD Tungsten

As device sizes continue to shrink, metals other than aluminum are being studied for use in the formation of interconnections, such as contacts/vias, metal suicides, etc. Tungsten, which can be deposited by chemical vapor deposition, has low resistance and stress, excellent step coverage, and a thermal expansion coefficient which closely matches silicon. However, one of the problems in the deposition of CVD tungsten is its low adhesion to dielectrics, so that a deposited adhesion layer, e.g. TiN, is generally used under tungsten. See, e.g., Wolf et al., *Silicon Processing for the VLSI Era, Volume 1—Process Technology* (1986), which is hereby incorporated by reference.

In addition to providing adhesion, the adhesion layer also reduces the deposition incubation time. However, as devices dimensions shrink, the requirements of an adhesion layer make it difficult to fill small contacts or vias with high aspect ratios, using the CVD W process, as the adhesive layer reduces the available space. Additionally, for applications using tungsten-capped polysilicon as a gate electrode, the adhesion layer adds process steps and increases cost.

Innovative Structures and Methods

The present application discloses several methods of forming a very thin adhesion layer under the CVD tungsten, or alternatively, of depositing CVD tungsten on silicon and dielectrics without an adhesion layer at all. In some embodiments, a very thin layer of silicon is formed on the surface of a silicon or dielectric layer, then nitrided in situ to form a very thin layer of silicon nitride. In other embodiments, a thin layer of tungsten is deposited over polysilicon, then nitrided in situ to form WNx. Either of these nitrided layers can provide an adhesion layer without unnecessary bulk. A further embodiment forms a thin layer of silicon, which is then exposed to WF6, causing the silicon to be replaced by a thin nucleation layer of tungsten. Further deposition of tungsten uses a WF6/H2 chemistry.

Advantages of the disclosed methods and structures follow. Not every advantage may be applicable to every embodiment:
- easy to manufacture;
- does not require a separate chamber for forming nitride;
- takes up less space in contact or via;
- effective in the formation of CVD tungsten on dielectric;
- effective in preventing reaction between tungsten and silicon;
- compatible with current process flow;
- produces an effective diffusion barrier.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 shows a generalized flowchart of the disclosed process, while

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Process

Figure 1:
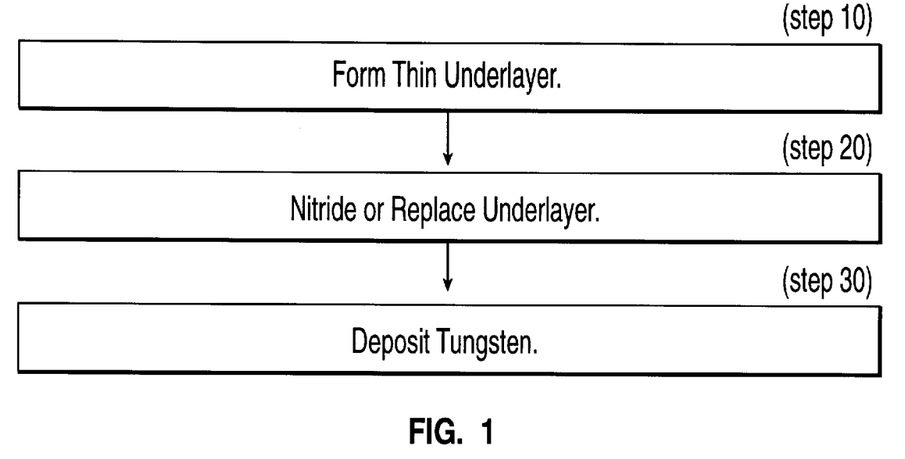

FIG. 1 is a generalized flowchart for the disclosed process. Depending on the specific use for the tungsten layer, the exposed surface on which the tungsten is to be deposited will typically be either polysilicon (e.g., a gate structure) or a dielectric (e.g., around a via or contact). As seen in this figure, a thin underlayer, generally less than 5 nm is first formed (step 10). This thin underlayer is then either nitrided or replaced in a substitution reaction (step 20). In the case of nitridation, this forms a nitride layer which is thin, uniform, a good adhesion layer, and a good barrier to diffusion; in the substitution reaction, a thin, conformal layer of tungsten is formed. Finally, the bulk tungsten is deposited (step 30) and processing continues.

Various embodiments will now be discussed in conjunction with the accompanying drawings.

First Process Embodiment: SiN Under-Layer for Plug

Figure 1A:
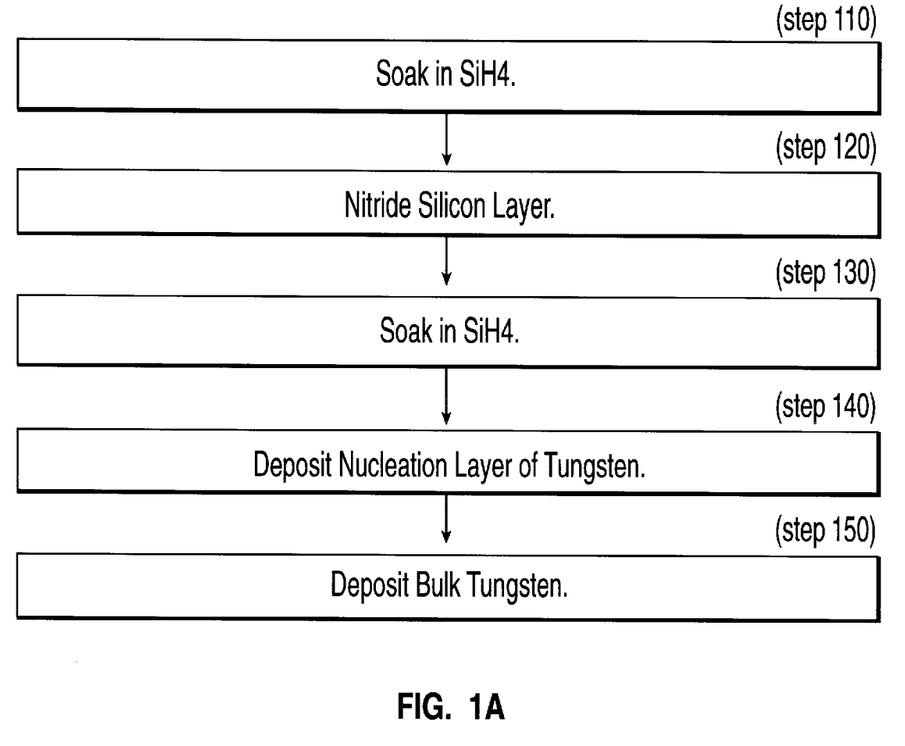
FIGS. 1A–C show flowcharts of various embodiments of the disclosed process.
Figure 2A:
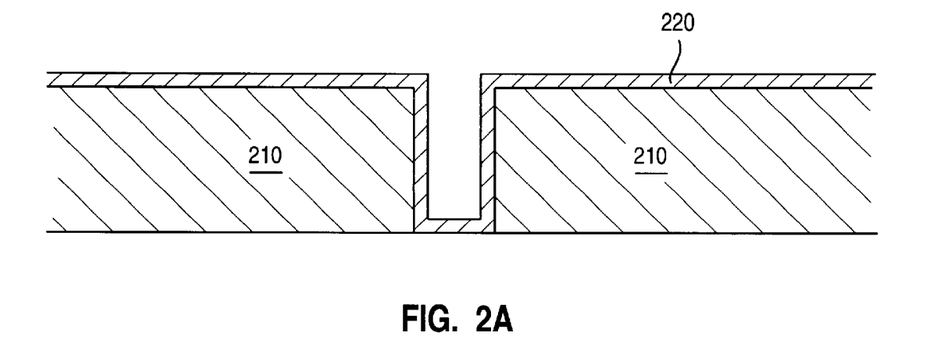
FIGS. 2A–C show cross-sections of a partially fabricated circuit which uses one of the disclosed embodiments.
Figure 2B:
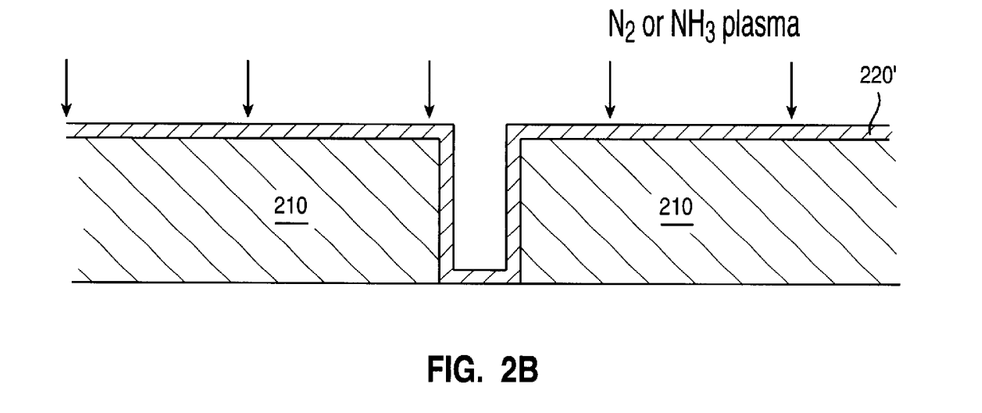
Figure 2C:
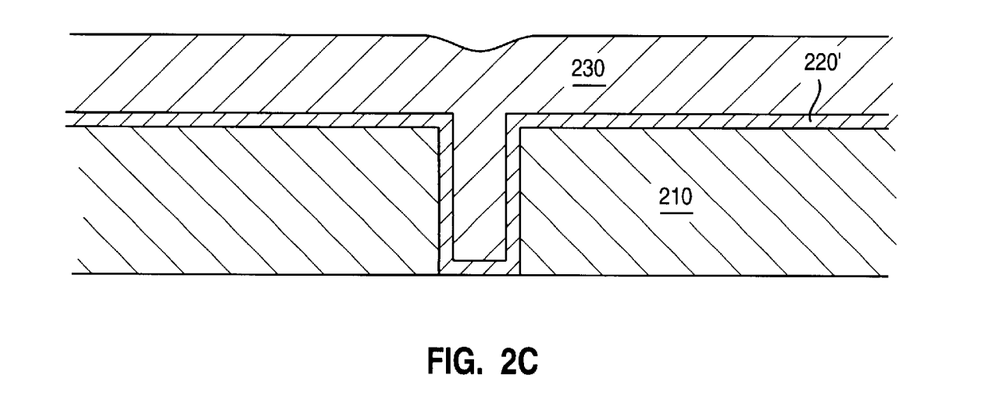

This embodiment uses an underlayer of nitrided silicon to provide adhesion within a plug. FIG. 1A is the flowchart for this embodiment, while FIGS. 2A–C show the progress of the fabrication process.

Dielectric layer 210 is exposed to SiH4 (step 110) at 4 Torr, 475 degrees C. for 30 seconds to form a thin layer of silicon 220. This layer of silicon 220 is nitrided (step 120), using N2 at a pressure of 0.7 Torr, temperature of 475 degrees C. for 30–60 seconds, forming layer 220' of SiNx. The Si3Nx should be as thin as possible, preferably less than its tunnelling thickness. A further SiH4 soak (step 130), using the same conditions, is performed to provide a thin layer of silicon (not shown) for tungsten deposition. A nucleation layer of tungsten is formed (step 140), using a ratio of WF6: SiH4 of 1:4, a pressure of 4 Torr, and a temperature of 475 degrees C. for 40 seconds. It is noted that during the formation of the nucleation layer, an excess of SiH4, i.e. a greater flow of SiH4 than of WF6, improves the deposition rate and adhesion. This is followed by bulk deposition of tungsten (step 150) using a chemistry of WF6 and H2 at 80 Torr and 475 degrees C., to complete formation of layer 230.

Second Process Embodiment: SiN Underlayer for Gate Stack

Figure 4A:
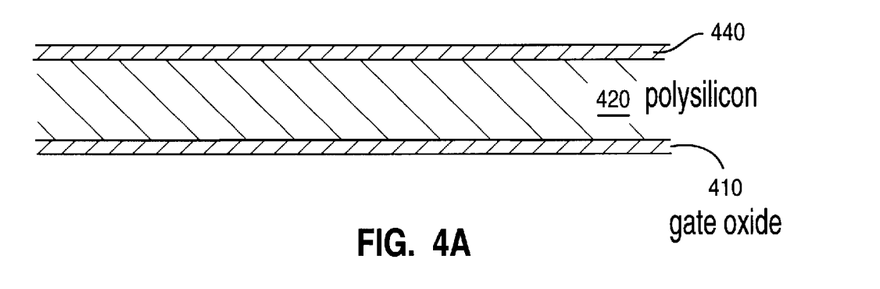
FIGS. 4A–C show cross-sections of a partially fabricated circuit which uses a further disclosed embodiment.
Figure 4B:
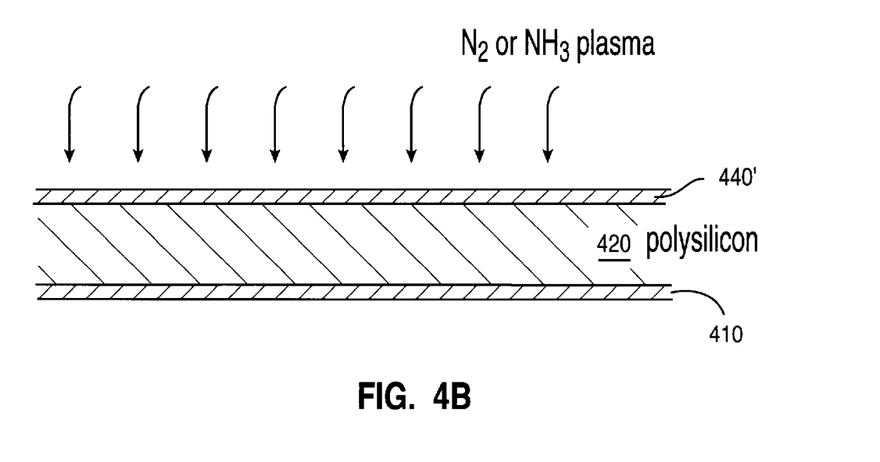
Figure 4C:
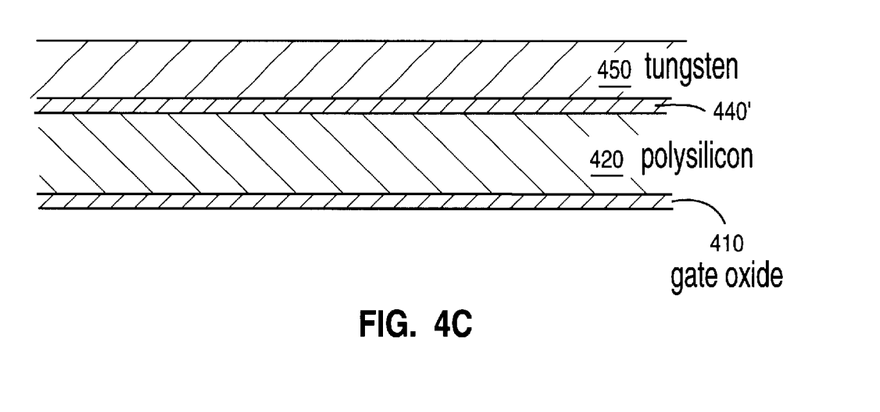

With the same process conditions as in the first embodiment, CVD W can be deposited on polysilicon to form a gate structure, as shown in FIGS. 4A–C. In FIG. 4A, polysilicon layer 420 has been formed over gate oxide 410. Thin layer of silicon 440 is deposited and nitrided in situ to form layer 440' of silicon nitride in FIG. 4B. This is followed by deposition of the tungsten layer 450, shown in FIG. 4C.

Results

With the above process conditions, a CVD tungsten layer was deposited on silicon and subjected to high temperature annealing. Results are shown in the following table. This process can provide a tungsten-capped polysilicon gate stack with low resistance, uniform tungsten deposition, stability without a W-Si reaction, even up to 850 degrees C. for 30 minutes, with good adhesion (passes tape test).

|  | Sheet Resistance (ohm/sq) |
|---|---|
| Pre annealing | 0.826 +/− 2.1% |
| Post annealing | 0.734 +/− 3.4% |

Third Process Embodiment: WN Underlayer on Gate

Figure 1B:
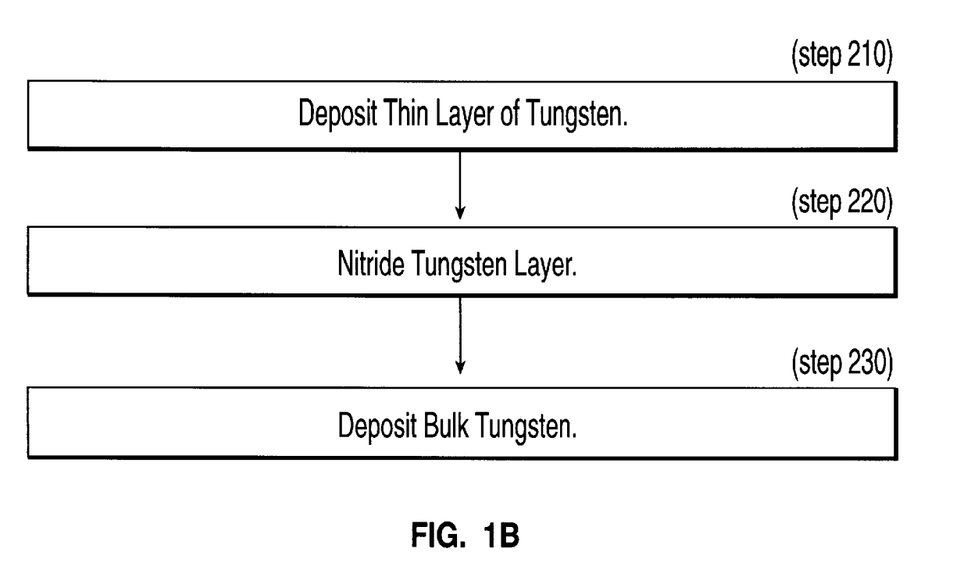
Figure 3A:
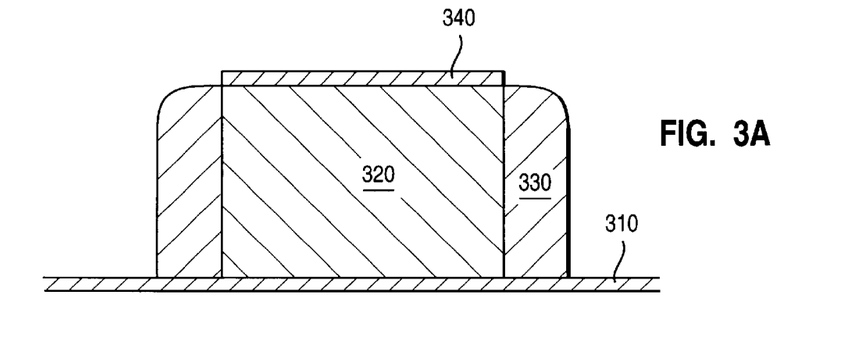
FIGS. 3A–C show cross-sections of a partially fabricated circuit which uses another of the disclosed embodiments.
Figure 3B:
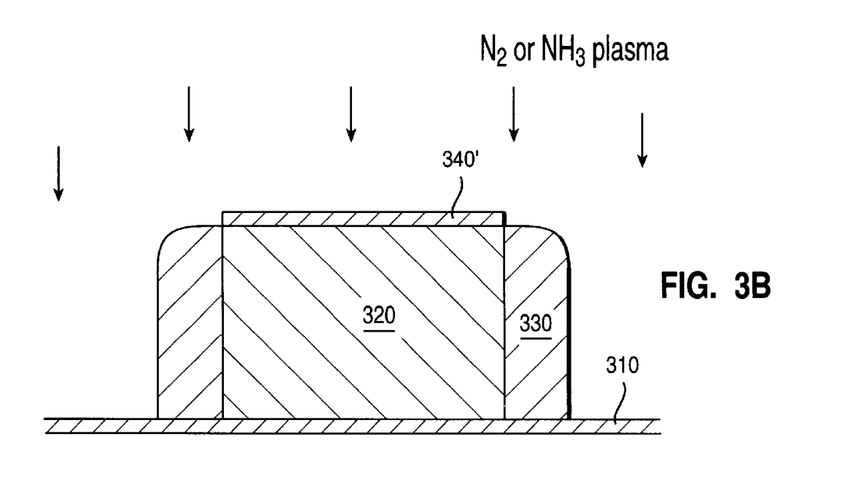
Figure 3C:
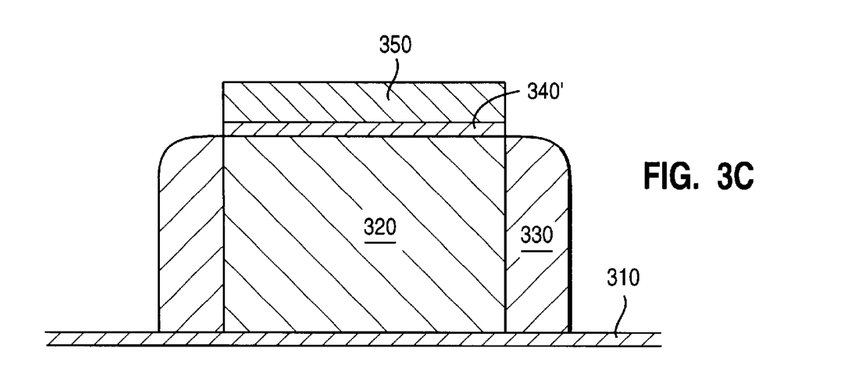

In this embodiment, an underlayer of tungsten nitride provides the adhesion layer for deposition of tungsten on a polysilicon gate. The flowchart is shown in FIG. 1B, with FIGS. 3A–C showing a cross-section of the gate during the disclosed process. Gate 320 is shown over gate oxide 310, and having sidewall spacers 330. A thin layer (5–10 nm or less) of tungsten 340 is formed (step 210) either by reacting WF6 with the polysilicon or by using a WF6+SiH6+H2 chemistry. Known processes can be used which will selectively deposit tungsten only on the polysilicon surface, but not on the surrounding dielectric surfaces. A plasma of N2 or NH3 is then used (step 220) to form WNx on the tungsten layer or to transform the thin tungsten 340 layer fully to WNx 340'. Pin-holes in the thin tungsten layer can also be passivated by the formation of SiNx. The bulk of tungsten layer 350 is then deposited (step 230) on the WNx using a WF6+H2 chemistry.

Fourth Process Embodiment: WN Underlayer for Gate Stack

Figure 5A:
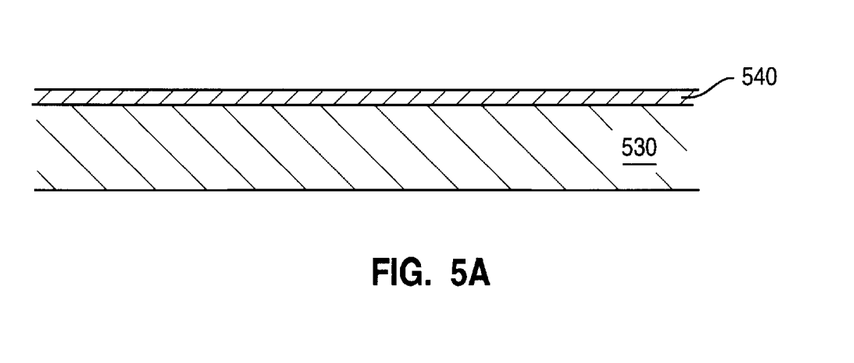
FIGS. 5A–C show cross-sections of a partially fabricated circuit which uses a further disclosed embodiment.
Figure 5B:
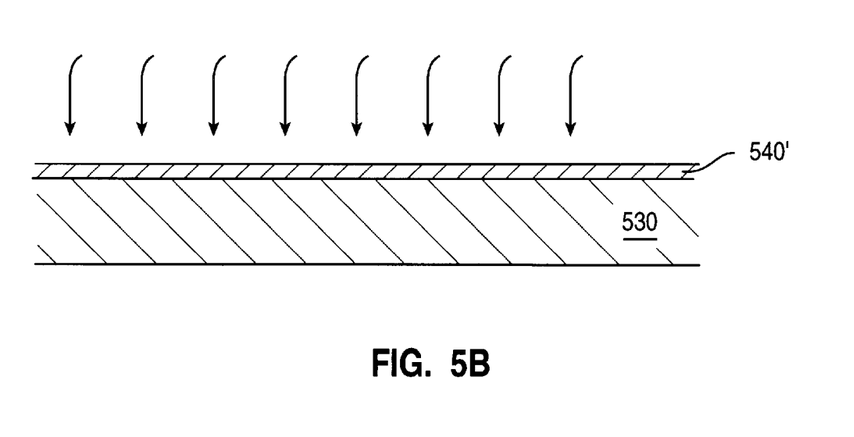
Figure 5C:
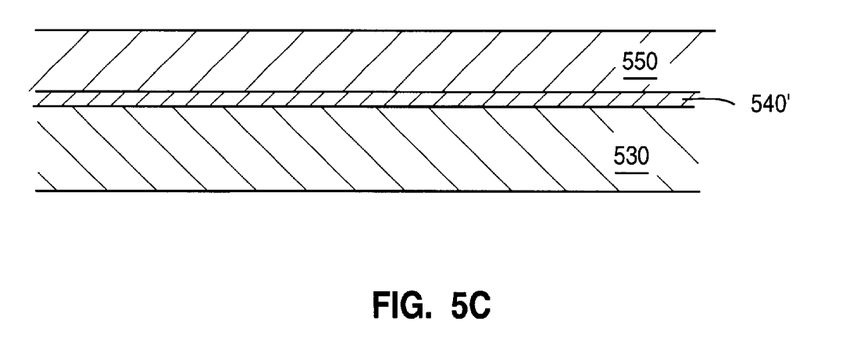

In this embodiment, WNx is formed on un-patterned polysilicon, as shown in FIGS. 5A–C. In FIG. 5A, a thin layer of tungsten (5–10 nm) 540 is formed over polysilicon 530 by reacting WF6 with the polysilicon, by using a WF6/SiH6/H2 chemistry, or by sputtering. A plasma nitridation with N2, NH3, or N2/NH3 is then used to transform this thin tungsten layer 540 to WNx 540', seen in FIG. 5B. The bulk of tungsten layer 550 is then deposited on the WNx using a WF6/H2 chemistry, as seen in FIG. 5C.

Fifth Deposition Process Embodiment: Sacrificial Si Layer for Plug

Figure 1C:
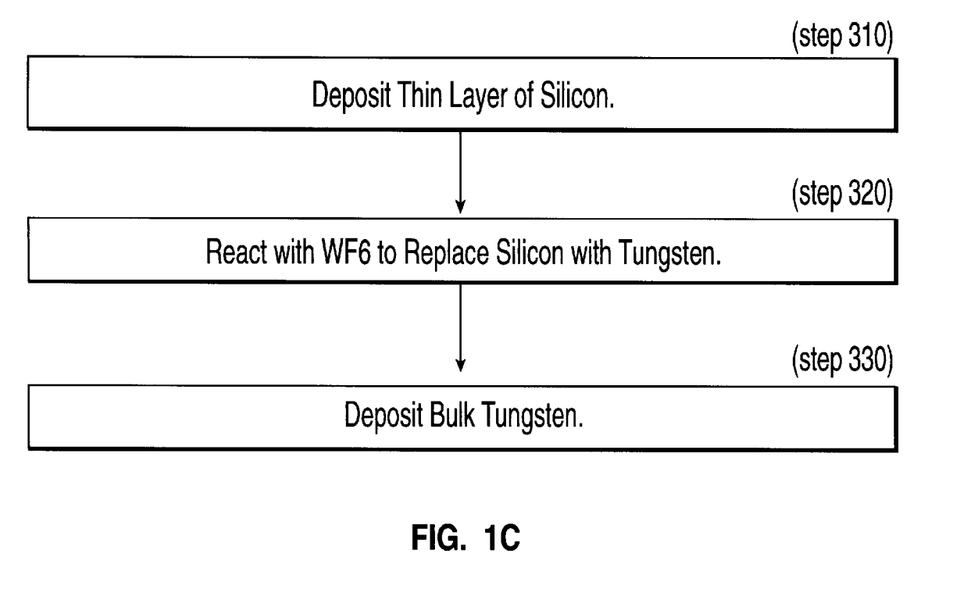

In this embodiment, a sacrificial Si layer is used to assist the filling of high aspect ratio (e.g., 8:1) contacts with tungsten to connect to lower level of tungsten or polysilicon. FIG. 1C shows the process of this embodiment, with the structure shown in FIGS. 6A–C.

Figure 6A:
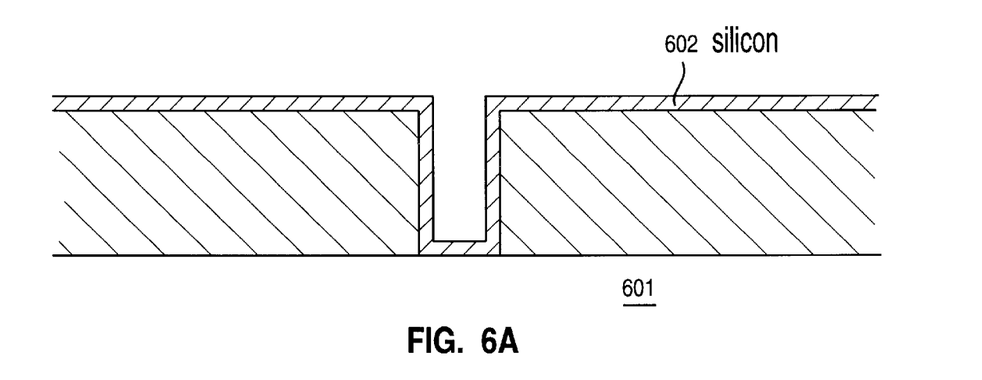
FIGS. 6A–C show cross-sections of a partially fabricated circuit which uses a further disclosed embodiment.
Figure 6B:
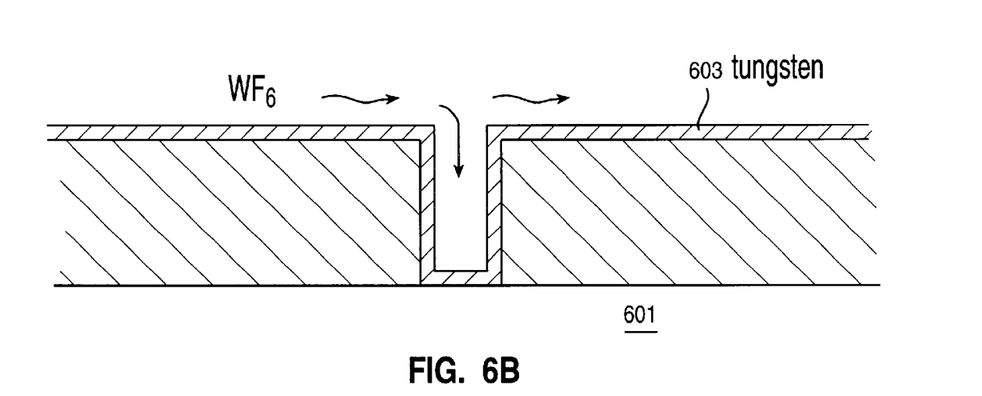
Figure 6C:
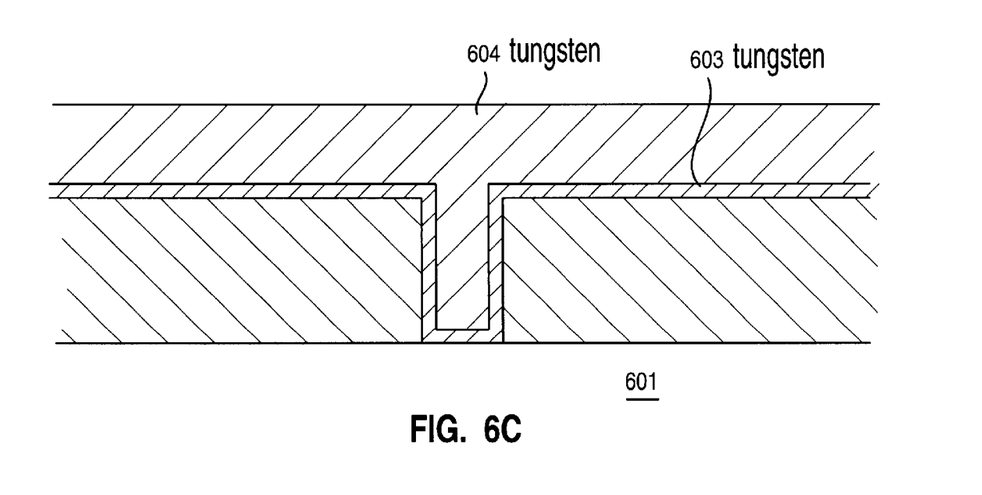

In FIG. 6A, a thin continuous Si layer 602 (preferably 10–15 nm) is deposited by LPCVD (low pressure CVD) or PECVD (plasma enhanced CVD) at temperature lower than 600 degrees C. into the contact or via that connect to a lower level of tungsten or polysilicon 601. The silicon layer preferably has an amorphous structure to reduce surface roughness. In FIG. 6B, this silicon layer was then displaced with tungsten 603 by reacting with WF6. The bulk of the plug 604 is then filled with W by using WF6/H2 chemistry, giving the structure shown in FIG. 6C.

According to a disclosed class of innovative embodiments, there is provided: A fabrication method, comprising the steps of: (a.) forming a thin layer of a first material over an underlying layer; (b.) nitriding said thin layer; (c.) depositing a layer of tungsten directly overlying said thin nitrided layer; whereby said layer of tungsten adheres to said underlying layer.

According to another disclosed class of innovative embodiments, there is provided: A fabrication method, comprising the steps of: (a) forming a thin silicon layer directly over a dielectric layer; (b) performing a reaction which replaces said thin silicon layer with a thin tungsten layer; (c) depositing a further layer of tungsten over said thin tungsten layer; whereby said layers of tungsten fill a via or contact in said dielectric layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the tungsten was shown as deposited over a polysilicon gate, the gate can be a layered structure or a composite of materials.

What is claimed is:

1. A fabrication method for adhering tungsten to an underlying layer of dielectric or silicon, comprising the steps of:

(a) providing an underlying layer;
   (b) forming a thin layer of a first material over said underlying layer;
   (c) nitriding said thin layer of first material, said nitrided layer of first material having a thickness less than the tunneling thickness of said nitrided layer of first material; and
   (d) depositing a layer of CVD tungsten in contact with said thin nitrided layer of first material, said layer of tungsten adhering to said underlying layer;
   wherein said underlying layer comprises polysilicon and said first material consists substantially of tungsten.

* * * * *